US005214561A

United States Patent [19]

Morita

[11] Patent Number: 5,214,561

[45] Date of Patent: May 25, 1993

[54] CURRENT CONTROL CIRCUIT FOR AN ELECTROMAGNETIC TYPE ACTUATOR

[75] Inventor: Shigeki Morita, Himeji, Japan

[73] Assignee: Mitsubishi Denki Kabushiki Kaisha, Tokyo, Japan

[21] Appl. No.: 783,777

[22] Filed: Oct. 29, 1991

[30] Foreign Application Priority Data

Nov. 1, 1990 [JP] Japan ........ 2-298262

[51] Int. Cl.[5] ........ H03K 3/01; H03K 5/08; G05F 1/40; F02D 41/20

[52] U.S. Cl. ........ 361/187; 323/282; 323/300; 361/152

[58] Field of Search ........ 361/187, 194, 160, 153, 361/154, 155, 156, 159, 152; 307/268; 323/300, 282

[56] References Cited

U.S. PATENT DOCUMENTS 4,978,865 12/1990 Hartmann et al. ........ 307/140

FOREIGN PATENT DOCUMENTS 75046 4/1987 Japan .
93459 4/1987 Japan .

*Primary Examiner*—A. D. Pellinen
*Assistant Examiner*—Aditya Krishnan
*Attorney, Agent, or Firm*—Sughrue, Mion, Zinn, Macpeak and Seas

[57] ABSTRACT

A current control circuit for controlling a current supplied to the coil 3 of an electromagnetic type actuator includes a power transistor 2 and a current detecting resistor 4 coupled in series with the coil 3. The voltage across the current detecting resistor 4 is amplified by a differential amplifier 10 and held by a capacitor 8 of a peak hold circuit 6. The input pulse signal A is smoothed by a smoothing circuit 14. A differential amplifier 18 compares the outputs C of the smoothing circuit 14 with that D of the peak hold circuit 6. The output of an OR gate 20 turns on the power transistor 2 either when the input pulse A or the output of the differential amplifier 18 is at the high level. The voltage held across the capacitor 8 is reset by the transistor 9 in response to the output of the OR gate 20. The duty factor of the power transistor 2 is automatically adjusted to compensate for the variations in the circuit characteristics.

4 Claims, 3 Drawing Sheets

CURRENT CONTROL CIRCUIT FOR AN ELECTROMAGNETIC TYPE ACTUATOR

BACKGROUND OF THE INVENTION

This invention relates to current control circuits for controlling the current supplied to an electromagnetic type actuator utilizing an electromagnet as an actuator element.

Generally, the operation of electromagnetic type actuators utilizing an electromagnet as an actuator element is controlled by the current supplied thereto. Thus, it is necessary to control the level of current precisely in order to ensure the desired operations of electromagnetic type actuators. For example, in the case of the ISC (idling speed control) actuator commonly utilized in automobiles for controlling the air intake of an automotive engine, the average current is maintained at a target level by a current control circuit which turns on and off a transistor at a predetermined frequency and controls the average current by adjusting the duty factor (the on/off ratio) thereof.

FIG. 1 shows the circuit organization of a conventional current control circuit for an ISC actuator. A pulse signal from a microprocessor, etc., is input to an input terminal 1 to drive a power transistor 2, which controls the current flowing through the coil 3 of the actuator. A free-wheeling diode 5 is coupled across the coil 3 to pass the current therethrough when the power transistor 2 is turned off. The current is supplied from the battery 21.

The current flowing through the coil 3 rises during the time when the power transistor 2 is turned on by an input pulse applied thereto via the input terminal 1; it decreases while flowing via the diode 5 when the power transistor 2 is turned off. The average current through the coil 3 can be controlled by the duty factor of the input pulse train supplied to the input terminal 1, since the pulse repetition frequency is sufficiently great.

In the case of the above conventional current control circuit for an electromagnetic type actuator, the average current through the coil 3 may vary with time due to the variations of the source voltage, or due to the changes of the coil resistance, etc., which is caused by the heat generated by the current flowing therethrough. Thus, the duty factor of the pulse signal supplied to the current control circuit is usually adjusted by a microcomputer in accordance with the level of the source voltage. However, the variation of the average current caused by the changes of the coil resistance, etc., is not adjusted for by the microcomputer, and hence the operation of the actuator lacks precision, and a precise control of the air intake is impossible.

SUMMARY OF THE INVENTION

It is therefore an object of this invention to provide a current control circuit for an electromagnetic type actuator which is capable of maintaining the average current at a target level irrespective of the variations in the source voltage level or changes in the coil resistance, etc.

The above object is accomplished in accordance with the principle of this invention by a current control circuit for controlling a current supplied to a coil of an electromagnetic type actuator in response to an input pulse signal, a duty factor of which corresponds to a target level of the current supplied to said coil, said current control circuit comprising: switching means for turning on and off a current supplied to said coil of the actuator; current detector means for detecting a level of current flowing through said coil of the actuator; peak hold circuit means for holding a voltage level corresponding to each peak level of the current detected by said current detector means; smoothing circuit means for smoothing said input pulse signal by a predetermined degree; comparison means for comparing outputs of said peak hold circuit means with said smoothing circuit means, said comparison means outputting a signal when a level of the output of said smoothing circuit means is higher than a level of the output of said peak hold circuit means; and OR gate means, having input terminals coupled to said input pulse signal and an output of said comparison means, said OR gate means turning on said switching means when either said input pulse signal or an output of said comparison means is generated, such that an average level of the current through said coil is controlled to the target level irrespective of variations in circuit characteristics of said electromagnetic type actuator.

Preferably said current detector means comprises a current detecting resistor coupled in series with said coil and said switching means to develop a voltage thereacross corresponding to a current flowing through said coil when said switching means is turned on; and said peak hold circuit means comprises: a capacitor for holding a voltage thereacross which corresponds to said voltage developed across said current detecting resistor; and a transistor coupled across said capacitor for resetting said capacitor in response to a pulse signal of said OR gate means.

BRIEF DESCRIPTION OF THE DRAWINGS

The features which are believed to be characteristic of this invention are set forth with particularity in the appended claims. The structure and method of operation of this invention itself, however, will be best understood from the following detailed description, taken in conjunction with the accompanying drawings, in which:

In the drawings, like reference numerals represent like or corresponding parts or portions.

DETAILED DESCRIPTION OF THE PREFERRED EMBODIMENT

Referring now to the accompanying drawings, the preferred embodiment of this invention is described.

Figure 1:
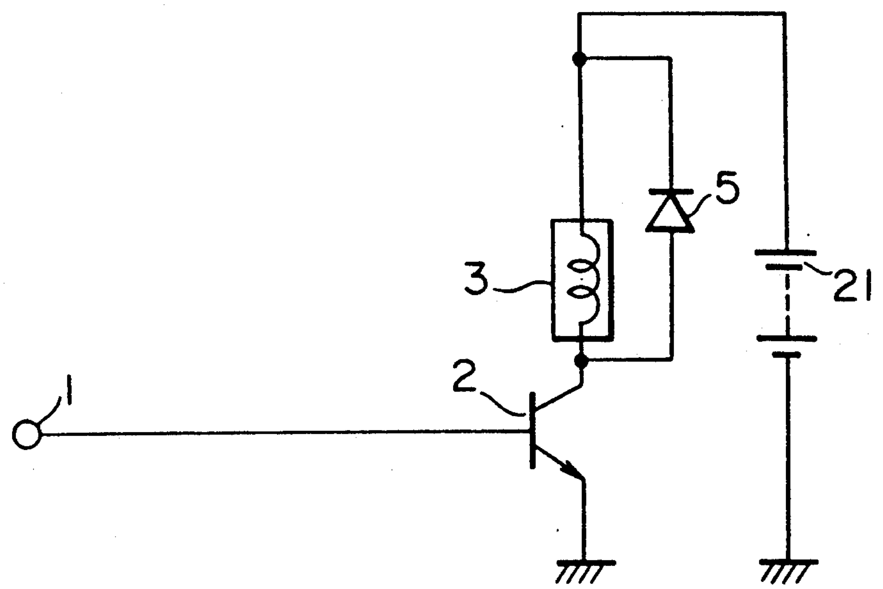
FIG. 1 PRIOR ART
FIG. 1 shows the circuit organization of a conventional current control circuit for an ISC actuator.
Figure 2:
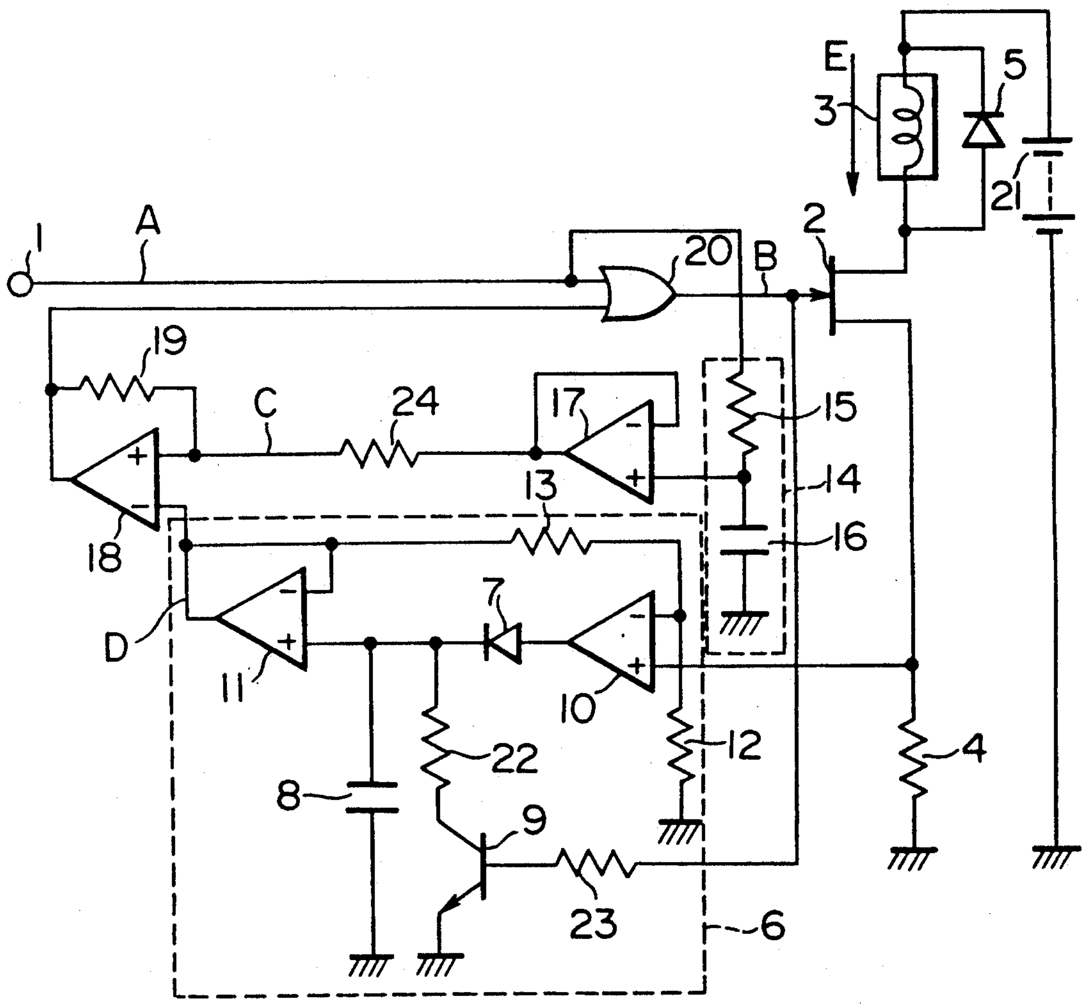
FIG. 2 is a circuit diagram showing a current control circuit for an electromagnetic type actuator according to an embodiment of this invention.

FIG. 2 is a circuit diagram showing a current control circuit for an electromagnetic type actuator according to an embodiment of this invention, in which the parts corresponding to those of FIG. 1 are designated by the same reference numerals. A coil 3 of the electromagnetic type actuator, supplied from a battery 21 and having a free-wheeling diode 5 coupled thereacross, is grounded via a power transistor 2 and a current detecting resistor 4. The power transistor 2 is constituted by a FET (field-effect transistor) in the case of this embodiment. However, a bipolar transistor may be utilized instead if an appropriate driver circuit therefor is provided.

The voltage level developed across the current detecting resistor 4 corresponds to the current level flowing through the coil 3 during the time when the power transistor 2 is turned on. The peak voltage levels developed across the current detecting resistor 4 are held by a peak hold circuit 6. The peak hold circuit 6 includes: a diode 7; a capacitor 8 for holding the peak voltage; a transistor 9 for resetting the capacitor 8 via a resistor 22 in response to a signal from an OR gate 20, which is supplied to the base thereof via a resistor 23; differential amplifiers 10 and 11 for amplifying the voltages across the current detecting resistor 4 and the capacitor 8, thereby obtaining the output signal D of the peak hold circuit 6; and resistors 12 and 13 for setting the gain of the differential amplifiers.

The pulse signal input A from the input terminal 1 is smoothed by a smoothing circuit 14. The smoothing circuit 14 consists of an RC circuit consisting of a resistor 15 and a capacitor 16 coupled across the input terminal 1 and the ground. The pulse signal supplied via the input terminal 1 and smoothed by the smoothing circuit 14 is buffered by a differential amplifier 17 and then is supplied to a non-inverting input terminal of a differential amplifier 18 via a resistor 24. The inverting input terminal of the differential amplifier 18 is coupled to the output of the differential amplifier 11 of the peak hold circuit 6. Thus, the differential amplifier 18 compares the output C of the differential amplifier 17 with that D of the peak hold circuit 6. A resistor 19 determines the hysteresis characteristic of the differential amplifier 18.

The pulse signal applied to the input terminal 1 and the output of the differential amplifier 18 are subjected to a logical OR operation via the OR gate 20. The output B of the OR gate 20 is coupled to the gate terminal of the power transistor 2 to control the on/off times and thereby the duty factor thereof.

Figure 3:
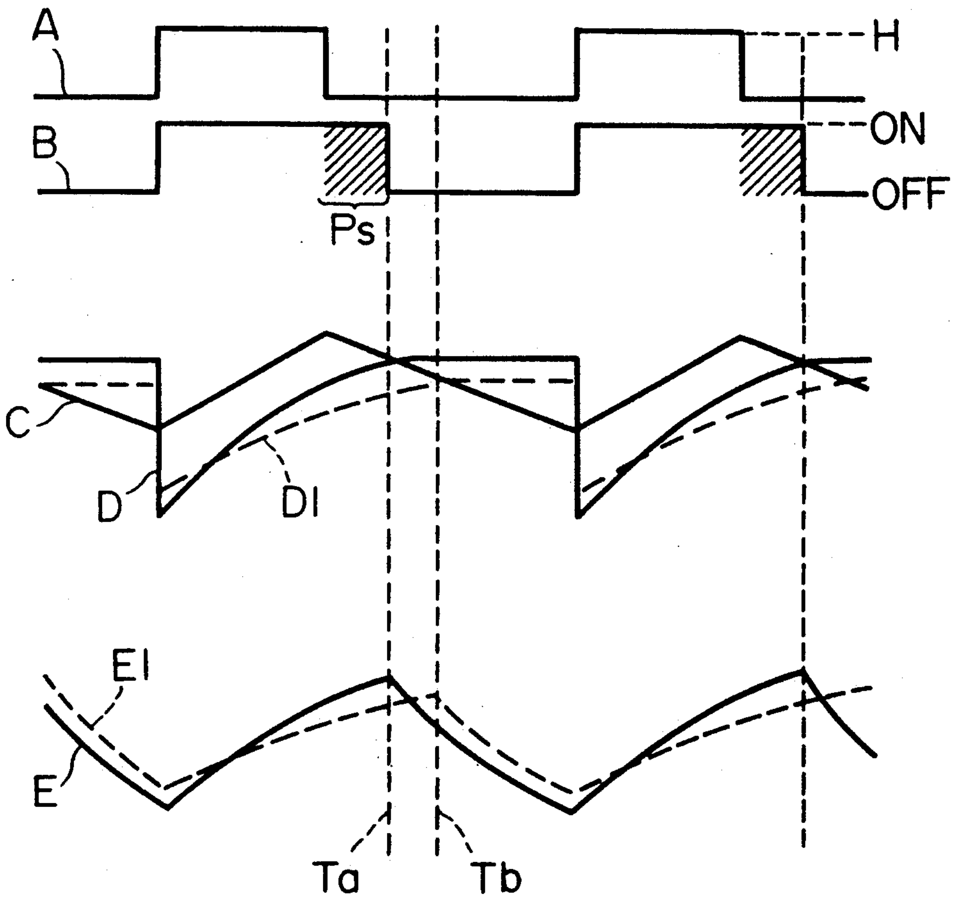
FIG. 3 is a timing chart showing the waveforms of various signals within the circuit of FIG. 2.

FIG. 3 is a timing chart showing the waveforms of various signals within the circuit of FIG. 2. When the voltage level of the pulse signal A rises to the high level H, the power transistor 2 is turned on, as indicated by the curve B representing the on/off times of the power transistor 2, such that current from the battery 21 flows through the coil 3 of the actuator via the power transistor 2. Thus, the current through the coil 3 increases as indicated by the waveform E.

At the same time, the smoothing capacitor 16 is charged via the resistor 15 by the high level voltage of the signal A. Thus, the voltage across the capacitor 16 and the output of the differential amplifier 17 increase as shown by the waveform C.

At the rising edge of the input pulse A, the transistor 9 is turned on to reset or discharge the capacitor 8 via the resistor 22 and the transistor 9. The voltage developed across the current detecting resistor 4 which corresponds to the level of current E flowing through the coil 3 is amplified via the differential amplifier 10 and then is supplied to the capacitor 8 to develop a voltage thereacross. During the time when the output of the OR gate 20 is at the high level and hence the transistor 9 is turned on, the voltage across the capacitor 8 increases following the increase of the level of current E flowing through the coil 3. The voltage developed across the capacitor 8 is amplified by the differential amplifier 11 by a gain determined by the resistors 12 and 13. The voltage across the capacitor 8 and the output of the differential amplifier 11 increase during this time as shown by the waveform D.

Thus, during the time when the pulse signal A is at the high level H, the output voltage C of the differential amplifier 17 is greater than the output voltage D of the differential amplifier 11, and thus the output of the differential amplifier 18 is at the high level.

When the level of the pulse signal A returns to the low level at the trailing edge of the pulse signal A, the capacitor 16 begins to be discharged via the resistor 15, such that the voltage thereacross and the output of the differential amplifier 17 begin to decrease as shown by the curve C. On the other hand, the current E flowing through the coil 3 and hence the voltage across the capacitor 8 and the output D of the differential amplifier 11 continue to increase. Thus, at the time point Ta, the curves C and D meet and cross each other, whereupon the output of the differential amplifier 18 falls from the high to the low level. In response thereto, the output B of the OR gate 20 also returns to the low level, to turn off the power transistor 2. Thus, the ON time duration of the power transistor 2 is greater by a width Ps than the width of the input pulse A. The duty factor of the power transistor 2 is thus adjusted with respect to the duty factor of the pulse signal A by an amount corresponding to the adjustable increment Ps, as described in detail below.

After the power transistor 2 is turned off at the crossing time Ta of the curves C and D, the current E flows through the coil 3 via the diode 5 and thus gradually decreases. On the other hand, the voltage across the capacitor 8 and hence the output of the differential amplifier 11 is maintained as indicated by the curve D, since the transistor 9 is turned off when the output B of the OR gate 20 returns to the low level.

At the next rising edge of the pulse signal A, the transistor 9 is turned on to reset the capacitor 8, and the above operations are repeated. The average level of the current E flowing through the coil 3 is controlled in accordance with the duty factor of the pulse signal A.

When, for example, the source voltage of the battery 21 decreases, there arises a tendency for the current E through the coil 3 to decrease. However, the pulse width increment Ps as described above is automatically adjusted to compensate for such decreasing tendency in the level of average current flowing through the coil 3. Namely, when the voltage across the battery 21 falls, the increase of the current E through the coil 3 which takes place after each rising edge of the pulse signal A becomes slower as indicated by the dotted curve E1. The increase of the output D of the differential amplifier 11 also becomes slower, as indicated by the dotted curve D1. Consequently, output D1 of the differential amplifier 11 meets the curve C at a later time point Tb than the time point Ta. Thus, the adjustable width Ps is extended to this time point Tb, and the ON time duration of the power transistor 2 is prolonged to this time point Tb. The duty factor of the power transistor 2 is thus adjusted automatically to compensate for the fall of the source voltage level.

The ON time duration of the power transistor 2 with respect to the pulse width of the signal A can be adjusted to a right length by an appropriate selection of the smoothing degree which is determined by the time constant of the RC circuit of the smoothing circuit 14. The greater the time constant of the RC circuit is, the larger the adjustment variation of the increment Ps becomes. If the time constant of the RC circuit is too great, the average of the current E increases as the source voltage falls. If the time constant of the RC circuit is too small, the average of the current E decreases as the source voltage falls. The average of the current E is maintained at the target level irrespective of the variations in the source voltage level when the time constant of the RC circuit 14 is set appropriately.

The current control circuit of FIG. 2 is capable of adjusting the duty factor of the power transistor 2 to compensate for the variation of the average current level caused by factors other than the fall of the source voltage level. The increment width Ps is automatically adjusted just as described above, when, for example, the resistance of the coil 3 increases to slow down the rise of the current E.

Thus, according to this invention, the duty factor of the power transistor is automatically adjusted to maintain the average current flowing through the coil of the actuator at the target level. Adjustments by a microprocessor by means of a program becomes unnecessary. Thus, if applied to an ISC (idling speed control) actuator, the air intake can be controlled precisely irrespective of variations in the source voltage or coil temperature.

What is claimed is:

1. A current control circuit for controlling a current (E) supplied to a coil (3) of an electromagnetic actuator in response to an input pulse signal (A), a duty factor of which corresponds to a target level of the current supplied to said coil, said current control circuit comprising:

a) switching means (2) for turning on and off a current supplied to said coil of the actuator; and b) means for controlling an average level of the current flowing through the coil such that the target level of the current is maintained irrespective of variations in circuit characteristics of the electromagnetic actuator, including source voltage variations and temperature induced coil resistance variations, said controlling means comprising:

c) current detector means (4) for detecting a level of current flowing through said coil of the actuator;

d) peak hold circuit means (6) for holding a voltage level corresponding to each peak level of the current detected by said current detector means;

e) smoothing circuit means (14) for smoothing said input pulse signal by a predetermined degree;

f) comparison means (18) for comparing outputs of said peak hold circuit means with said smoothing circuit means, said comparison means outputting a signal when a level of the output (C) of said smoothing circuit means is higher than a level of the output (D) of said peak hold circuit means; and g) OR gate means (20), having input terminals coupled to said input pulse signal and an output of said comparison means, said OR gate means turning on said switching means when either said input pulse signal or an output of said comparison means is generated.

2. A current control circuit as claimed in claim 1, wherein:

said current detector means comprises a current detecting resistor coupled in series with said coil and said switching means to develop a voltage thereacross corresponding to a current flowing through said coil when said switching means is turned on; and said peak hold circuit means comprises:

a capacitor (8) for holding a voltage thereacross which corresponds to said voltage developed across said current detecting resistor; and a transistor (9) coupled across said capacitor for resetting said capacitor in response to a pulse signal of said OR gate means.

3. A current control circuit as claimed in claim 1, wherein said smoothing circuit means comprises a serial connection of resistor (15) and a capacitor (16) coupled to said input pulse signal.

4. A current control circuit as claimed in claim 1, wherein said switching means comprises a power transistor.

* * * * *